United States Patent
Takagi et al.

(10) Patent No.: US 6,275,688 B1
(45) Date of Patent: Aug. 14, 2001

(54) DOUBLE BALANCED MIXER

(75) Inventors: Minoru Takagi; Masahiro Tsukahara, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/252,931

(22) Filed: Feb. 19, 1999

(30) Foreign Application Priority Data

Apr. 22, 1998 (JP) .................................................. 10-112426

(51) Int. Cl.$^7$ ...................................................... H04Q 7/20
(52) U.S. Cl. ........................... 455/326; 455/333; 327/359
(58) Field of Search .................................. 455/323, 326, 455/330, 333, 318, 189, 209; 327/355, 356, 359, 113, 105; 330/252, 261; 332/105; 329/348

(56) References Cited

U.S. PATENT DOCUMENTS

| | | | | |
|---|---|---|---|---|
| 3,812,434 | * | 5/1974 | Lommers et al. | 330/252 |
| 4,074,075 | * | 2/1978 | Ohsawa | 329/348 |
| 4,768,000 | * | 8/1988 | Pavio Jr. et al. | 332/170 |
| 4,937,516 | * | 6/1990 | Sempel | 323/315 |
| 5,179,731 | * | 1/1993 | Trankle et al. | 455/304 |
| 5,210,504 | * | 5/1993 | Yagita et al. | 330/253 |
| 5,448,772 | * | 9/1995 | Grandfield | 455/333 |
| 5,559,457 | * | 9/1996 | Uda et al. | 327/116 |
| 5,748,049 | * | 5/1998 | Bayruns et al. | 331/49 |
| 5,805,987 | * | 9/1998 | Kamase | 455/326 |
| 5,825,231 | * | 10/1998 | Chevallier et al. | 327/356 |
| 5,991,612 | * | 11/1999 | Saito | 455/234.1 |
| 6,018,270 | * | 1/2000 | Stuebing et al. | 330/278 |
| 6,054,899 | * | 4/2000 | Ke | 330/278 |
| 6,073,002 | * | 6/2000 | Peterson | 455/326 |
| 6,100,731 | * | 8/2000 | Otaka | 327/119 |
| 6,140,849 | * | 10/2000 | Trask | 327/113 |

FOREIGN PATENT DOCUMENTS 2-47904   2/1990 (JP) .

* cited by examiner

Primary Examiner—Nay Maung
Assistant Examiner—Jean A Gelin
(74) Attorney, Agent, or Firm—Armstrong, Westerman, Hattori, McLeland & Naughton, LLP

(57) ABSTRACT

A double balanced mixer which may be used in communications devices, such as portable or cellular telephones. The mixer includes a first differential amplifier having a first transistor pair whose emitters are connected together, a second differential amplifier having a second transistor pair whose emitters are connected together, and a third differential amplifier having a third transistor pair whose emitters are connected together by way of a resistor. A first constant current source is connected between the emitter of one of the transistors of the third transistor pair and ground. A second constant current source is connected between the emitter of the other transistor of the third transistor pair and ground. A gate circuit is connected to one of the first and second current sources for selectively activating the one connected current source. By selectively activating the current source, the mixer has low power consumption.

13 Claims, 10 Drawing Sheets

DOUBLE BALANCED MIXER

BACKGROUND OF THE INVENTION

The present invention generally relates to a double balanced mixer, and, more particularly, to a double balanced mixer used in mobile communication device such as portable telephones.

Figure 1:
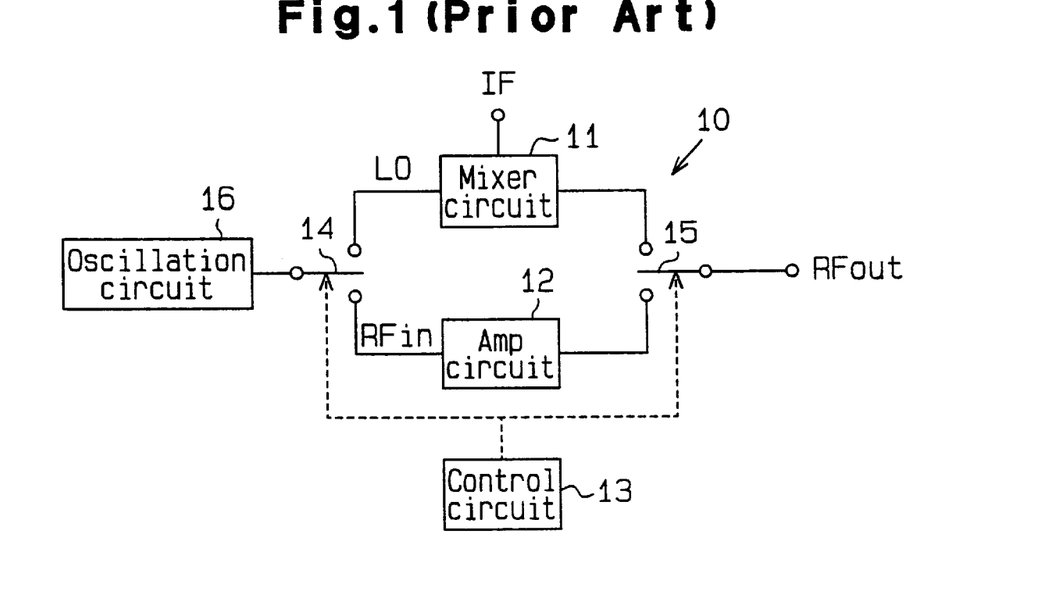
FIG. 1 is a schematic block diagram of a conventional communication device.

FIG. 1 is a schematic block diagram of a conventional mobile communication device 10, such as a portable telephone, that can perform analog and digital communications.

The communication device 10 is equipped with a mixer circuit 11 for digital communications and an amp circuit 12 for analog communications. The communication device 10 is also equipped with switches 14 and 15 for switching between the mixer circuit 11 and the amp circuit 12 in order to allow sharing of elements, such as antennas, between the analog and digital communications.

In digital communications, a control circuit 13 operates the switches 14 and 15 to active the mixer circuit 11. In this case, an oscillation signal output from an oscillation circuit 16 is input to the mixer circuit 11 as a carrier signal LO via the switch 14. The mixer circuit 11 generates an output signal RFout by mixing the carrier signal LO and a base band signal IF having an intermediate frequency. The output signal RFout is supplied to a subsequent circuit (not shown) via the switch 15.

In analog communications, the control circuit 13 operates the switches 14 and 15 to active the amp circuit 12. In this case, the oscillation signal output from the oscillation circuit 16 is input to the amp circuit 12 via the switch 14 as an input signal RFin. The amp circuit 12 generates the output signal RFout by amplifying the input signal RFin. The output signal RFout is supplied to the subsequent circuit via the switch 15.

The circuit area of the communication device 10 is increased by including both of the amp circuit 12 and the mixer circuit 11. Further, because the communication device 10 also requires the switches 14 and 15, its circuit area is further increased.

To make the communication device 10 compact, it would be advantageous to also use the mixer circuit 11 as an amp circuit in analog communications.

Figure 2:
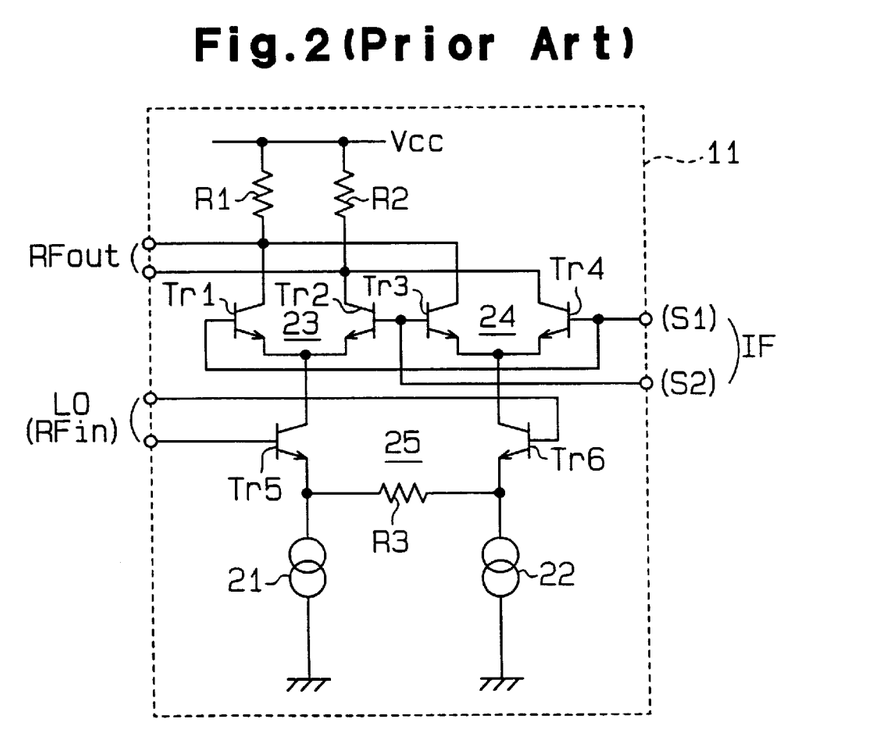
FIG. 2 is a circuit diagram of a conventional double balanced mixer circuit.

FIG. 2 is a schematic circuit diagram of the mixer circuit 11. The mixer circuit 11 is a double balanced mixer (DBM). The mixer circuit 11 includes transistors Tr1 to Tr6, resistors R1 to R3, and constant-current sources 21 and 22. The first and second transistors Tr1 and Tr2 form a first differential amplifier 23 in which both emitters are connected to each other. The collectors of the first and second transistors Tr1 and Tr2 are connected to a high potential power supply Vcc via the resistors R1 and R2.

The third and fourth transistors Tr3 and Tr4 form a second differential amplifier 24 in which both emitters are connected to each other. The collectors of the third and fourth transistors Tr3 and Tr4 are connected to the high potential power supply Vcc via the resistors R1 and R2.

The fifth and sixth transistors Tr5 and Tr6 form a third differential amplifier 25 in which both emitters are connected to each other via the resistor R3. The emitters of the fifth and sixth transistors Tr5 and Tr6 are connected to low potential power supplies (grounds GND) via the constant-current sources 21 and 22.

The collector of the fifth transistor Tr5 is connected to the emitters of the first and second transistors Tr1 and Tr2. The collector of the sixth transistor Tr6 is connected to the emitters of the third and fourth transistors Tr3 and Tr4.

As the mixer circuit, the base band signal IF is applied to the bases of the first to fourth transistors Tr1 to Tr4, and the carrier signal LO is applied to the bases of the fifth and sixth transistors Tr5 and Tr6. Then, the output signal RFout is output from the collectors of the first and third transistors Tr1 and Tr3 and the collectors of the second and fourth transistors Tr2 and Tr4.

As the amp circuit, a first control signal S1 is applied to the bases of the first and fourth transistors Tr1 and Tr4 and a second control signal S2 is applied to the bases of the second and third transistors Tr2 and Tr3. In this case, the first and second control signals S1 and S2 are set so that the first and second differential amplifiers 23 and 24 will be unbalanced.

For example, the first control signal S1 having an H level is applied to the bases of the first and fourth transistors Tr1 and Tr4 and the second control signal S2 having an L level is applied to the bases of the second and third transistors Tr2 and Tr3. Hence, the first and fourth transistors Tr1 and Tr4 turn on and the second and third transistors Tr2 and Tr3 turn off. Thus, the mixer circuit 11 operates as a differential amplifier by using the third differential amplifier 25. In other words, the fifth and sixth transistors Tr5 and Tr6 amplify the input signal RFin applied to the bases, and the output signal RFout is output from the collectors of the first and fourth transistors Tr1 and Tr4.

When the mixer circuit 11 operates as an amp, the two constant-current sources 21 and 22 are operating. However, the third differential amplifier 25 can be operated only by either the constant-current source 21 or 22. Accordingly, during amp operation, unnecessary current flows in the mixer circuit 11. Consequently, the power consumption of the circuit is greater than necessary.

It is an object of the present invention to provide a double balanced mixer having a small size and low power consumption.

SUMMARY OF THE INVENTION

Briefly stated, the present invention provides a double balanced mixer includes a first differential amplifier including a first pair of transistors having their emitters connected to each other, a second differential amplifier including a second pair of transistors having their emitters connected to each other, and a third differential amplifier, connected to the first and second differential amplifiers, including a third pair of transistors having their emitters connected to each other via a resistor. First and second constant-current sources are connected to the emitters of the third pair of transistors, respectively. A gate circuit is connected to one of the first and second constant-current sources and selectively activates the connected one of first and second constant-current sources in response to a control signal.

The present invention provides an orthogonal modulator includes a frequency multiplier for receiving a carrier signal and generating a multiplied signal in which the frequency of the carrier signal is multiplied by a predetermined factor. A phase shifter is connected to the frequency multiplier, receives the multiplied signal and generates a first carrier signal which is an in-phase component of the carrier signal, and a second carrier signal which is an orthogonal component of the carrier signal, by dividing the multiplied signal. A first mixer is connected to the phase shifter, receives the first carrier signal and a first base band signal and generates a first modulation signal by mixing the first carrier signal and the first base band signal. A second mixer is connected to the phase shifter, receives the second carrier signal and a second base band signal and generates a second modulation signal by mixing the second carrier signal and the second base band signal. An adder is connected to the first and second mixers, receives the first and second modulation signals and generates an output signal by adding the first and second modulation signals. The first mixer includes a first differential amplifier including a first pair of transistors having their emitters connected to each other and their bases receiving the first carrier signal, a second differential amplifier including a second pair of transistors having their emitters connected to each other and their bases receiving the first carrier signal, and a third differential amplifier, connected to the first and second differential amplifiers, including a third pair of transistors having their emitters connected to each other via a resistor and their bases receiving the first base band signal. First and second constant-current sources are connected to the emitters of the third pair of transistors, respectively. A first gate circuit is connected to one of the first and second constant-current sources and selectively activates the connected one of the first and second constant-current sources in response to a control signal. The second mixer includes a fourth differential amplifier including a fourth pair of transistors having their emitters connected to each other and their bases receiving the second carrier signal, a fifth differential amplifier including a fifth pair of transistors having their emitters connected to each other and their bases receiving the second carrier signal, a sixth differential amplifier, connected to fourth and fifth differential amplifiers, including a six pair of transistors having their emitters connected to each other via a resistor and their bases receiving the second base band signal. Third and fourth constant-current sources are connected to the emitters of the sixth pair of transistors, respectively A second gate circuit is connected to one of the third and fourth constant-current sources and selectively activates the connected one of the third and fourth constant-current sources in response to the control signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 3:
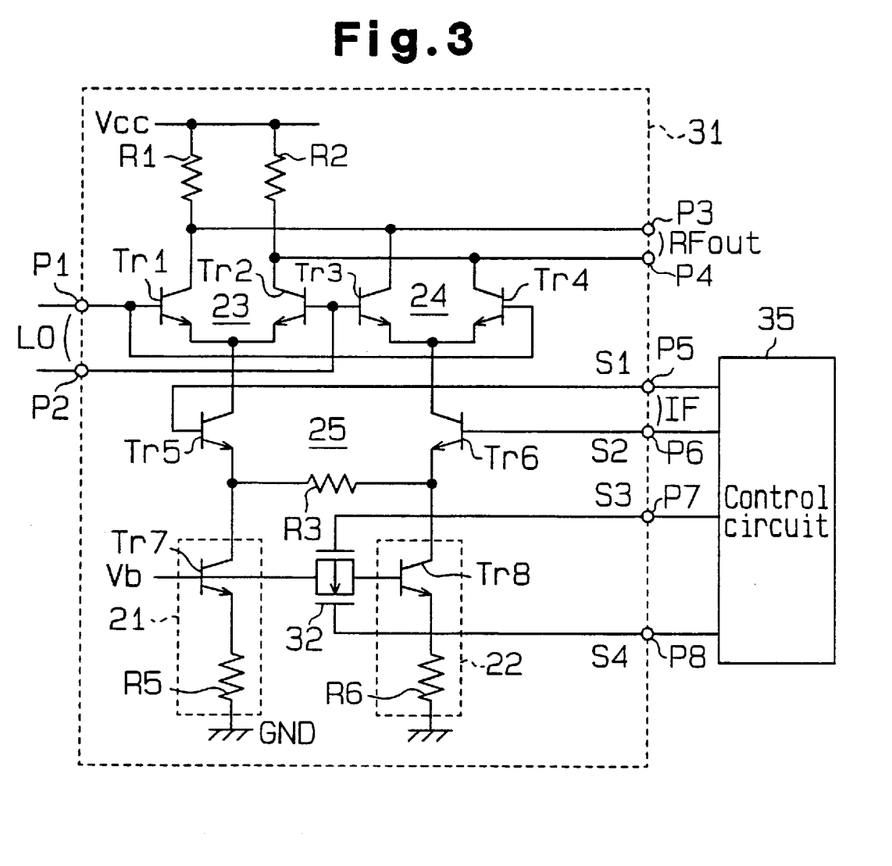
FIG. 3 is a circuit diagram of a double balanced mixer circuit according to a first embodiment of the present invention.

FIG. 3 is a schematic circuit diagram of a mixer circuit 31 according to a first embodiment of the present invention. The mixer circuit 31 is preferably a double balanced mixer (DMB). The mixer circuit 31 includes the transistors Tr1 to Tr6, the resistors R1 to R3, the constant-current sources 21 and 22, and a transmission gate (TR gate) 32 as a switching element. The first and second transistors Tr1 and Tr2 have their emitters connected to each other and form the first differential amplifier 23. The collectors of the first and second transistors Tr1 and Tr2 are connected to the high potential power supply Vcc via the resistors R1 and R2. The base of the first transistor Tr1 is connected to a terminal P1, and the base of the second transistor Tr2 is connected to a terminal P2.

The third and fourth transistors Tr3 and Tr4 have their emitters connected to each other and form the second differential amplifier 24. The collectors of the third and fourth transistors Tr3 and Tr4 are connected to the high potential power supply Vcc via the resistors R1 and R2. The base of the third transistor Tr3 is connected to the terminal P2 and the base of the fourth transistor Tr4 is connected to the terminal P1.

The collectors of the first and third transistors Tr1 and Tr3 are connected to a terminal P3, and the collectors of the second and fourth transistors Tr2 and Tr4 are connected to a terminal P4.

The fifth and sixth transistors TrS and Tr6 have their emitters connected to each other via the resistor 3 and form the third differential amplifier 25. The emitters of the fifth and sixth transistors Tr5 and Tr6 are connected to the low potential power supplies (grounds GND) via the constant-current sources 21 and 22.

The collector of the fifth transistor Tr5 is connected to the emitters of the first and second transistors Tr1 and Tr2. The collector of the sixth transistor Tr6 is connected to the emitters of the third and fourth transistors Tr3 and Tr4. The base of the fifth transistor Tr5 is connected to a terminal P5, and the base of the sixth transistor Tr6 is connected to a terminal P6.

The first constant-current source 21 includes a seventh transistor Tr7 and a resistor R5. The seventh transistor Tr7 has a collector connected to the emitter of the fifth transistor Tr5, an emitter connected to the ground GND via the resistor R5, and a base connected to a bias voltage Vb.

The second constant-current source 22 includes an eighth transistor Tr8 and a resistor R6. The eighth transistor Tr8 has a collector connected to the emitter of the sixth transistor Tr6, an emitter connected to the ground GND via the resistor R6, and a base that receives the bias voltage Vb via the TR gate 32. The TR gate 32 is preferably a CMOS transmission gate and includes a P-channel MOS transistor (PMOS transistor) and an N-channel MOS transistor (NMOS transistor). The gate of the PMOS transistor is connected to a terminal P7 and the gate of the NMOS transistor is connected to a terminal P8.

A control circuit 35 is connected to the terminals P5 to P8 and supplies various signals to each of the terminals P5 to P8 according to the communication state (communication method) of a communication device. Specifically, the control circuit 35 supplies the base band signal IF or the first and second control signals S1 and S2 to the terminals P5 and P6 and supplies the third and fourth control signals S3 and S4 to the terminals P7 and P8. The mixer circuit 31 operates as either the mixer circuit or the amp circuit in response to the various signals S1 to S4.

For digital communications, the control circuit 35 supplies the base band signal IF having an intermediate frequency to the terminals P5 and P6. The control circuit 35 further supplies the third control signal S3 having an L level to the terminal P7 and supplies the fourth control signal S4 having an H level to the terminal P8.

The TR gate 32 turns on in response to the third control signal S3 having an L level and the fourth control signal S4 having an H level, which allows the bias voltage Vb to be applied to the base of the eighth transistor Tr8, and the second constant-current source 22 to operate. Hence, the mixer circuit 31 operates as a double balanced mixer. In other words, the mixer circuit 31 generates the output signal RFout by mixing the carrier signal LO supplied to the terminals P1 and P2 and the base band signal IF supplied to the terminals P5 and P6. The output signal RFout is output from the terminals P3 and P4.

For analog communications, the control circuit 35 supplies the first control signal S1 having an H level and the second control signal S2 having an L level to the terminals P5 and P6, respectively, so that the third differential amplifier 25 is unbalanced. The control circuit 35 further supplies the third control signal S3 having an H level and the fourth control signal S4 having an L level to the terminals P7 and P8, respectively, so that the operation of the second constant-current source 22 is stopped.

The fifth transistor Tr5 turns on in response to the first control signal Sl having an H level. The sixth transistor Tr6 turns off in response to the second control signal S2 having an L level. The TR gate 32 turns off in response to the third control signal S3 having an H level and the fourth control signal S4 having an L level. Hence, the supply of the bias voltage Vbto the eighth transistor Tr8 is stopped, and the operation of the second constant source 22 stops.

Figure 4:
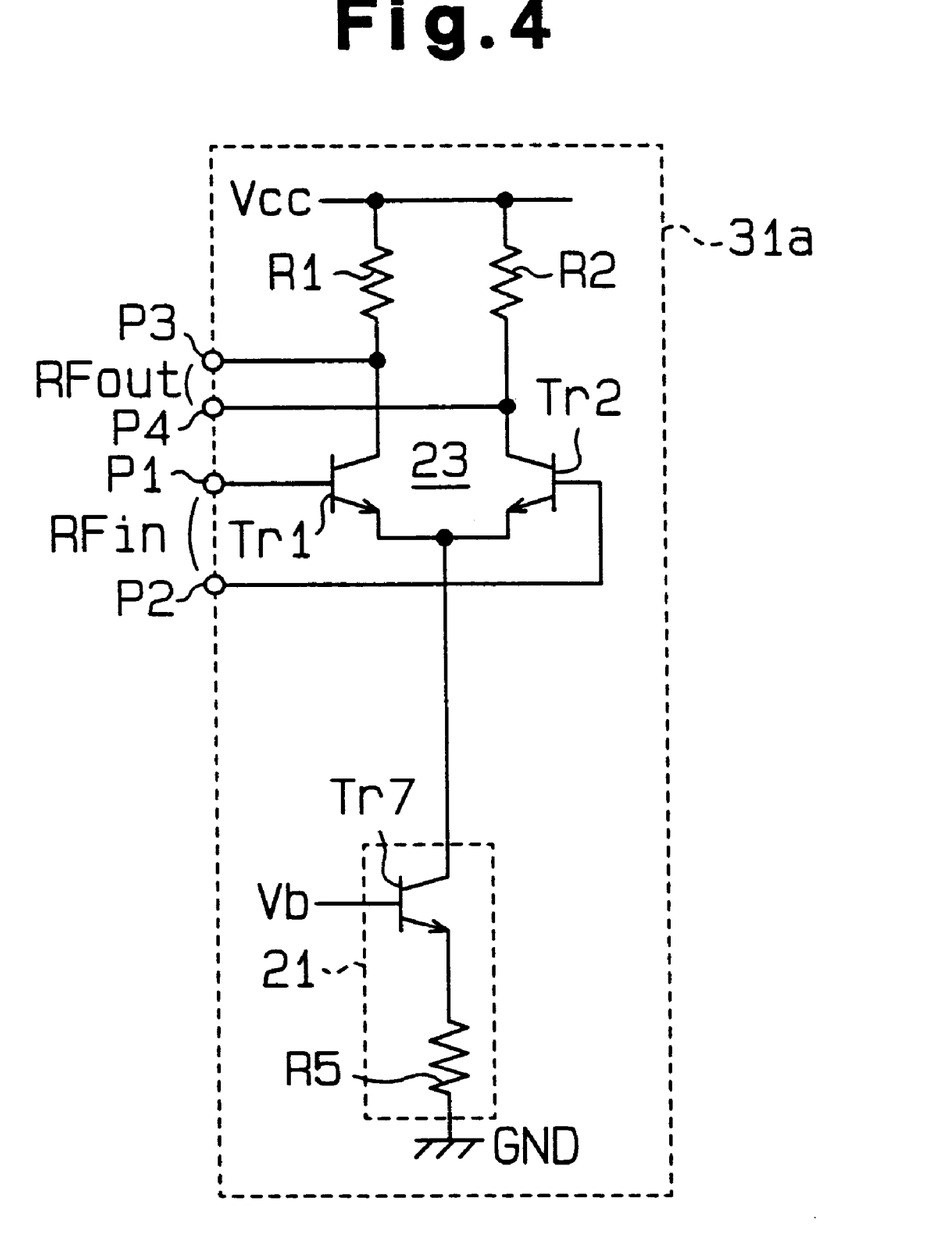
FIG. 4 is an equivalent circuit diagram of the double balanced mixer circuit of FIG. 3 in during operation.

When the fifth transistor Tr5 turns on, an amp circuit (differential amplification circuit) 31a is equivalently formed by the first differential amplifier 23 and the first constant-current source 21 as shown in FIG. 4. The amp circuit 31a receives the input signal RFin via the terminals P1 and P2 and generates the output signal RFout by amplifying the input signal RFin. The output signal RFout is output from the terminals P3 and P4.

At this time, because no current flows in the second constant-current source 22, the current consumption during amp operation is reduced, as compared to the operation of the prior art circuit 11. Further, the sixth transistor Tr6 turns off and the second constant-current source 22 and the second differential amplifier 24 stop operation. Accordingly, no current flows in the second differential amplifier 24. This reduces a spurious signal for the output signal RFout and further reduces the current consumption.

Figure 5:
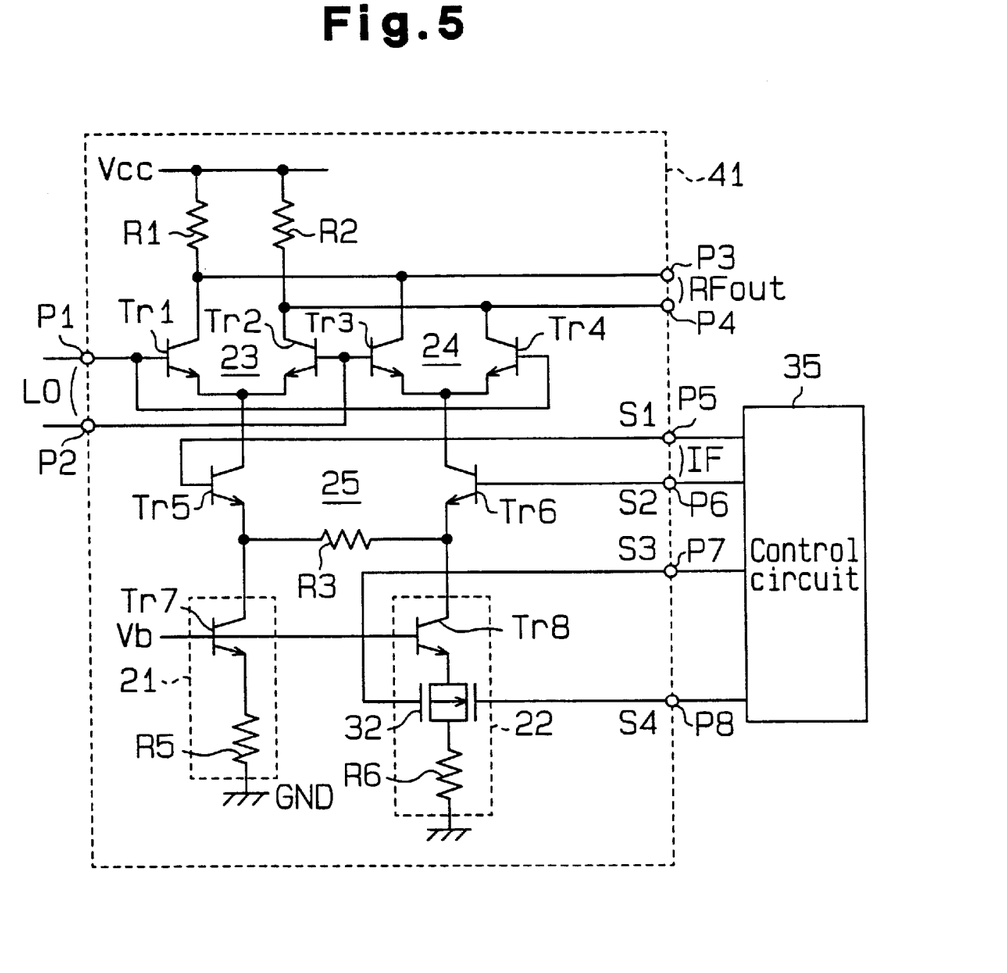
FIG. 5 is a circuit diagram of a double balanced mixer circuit according to a second embodiment of the present invention.

FIG. 5 is a circuit diagram of a mixer circuit 41 according to a second embodiment of the present invention. For the second embodiment, the TR gate 32 is connected between the eighth transistor Tr8 and the resistor R6. In this configuration, the bias voltage Vb is applied to the eighth transistor Tr8 during amp operation. However, because the TR gate 32 turns off, no current flows in the eighth transistor Tr8. Hence, the operation of the second constant-current source 22 stops and the power consumption is reduced.

Figure 6:
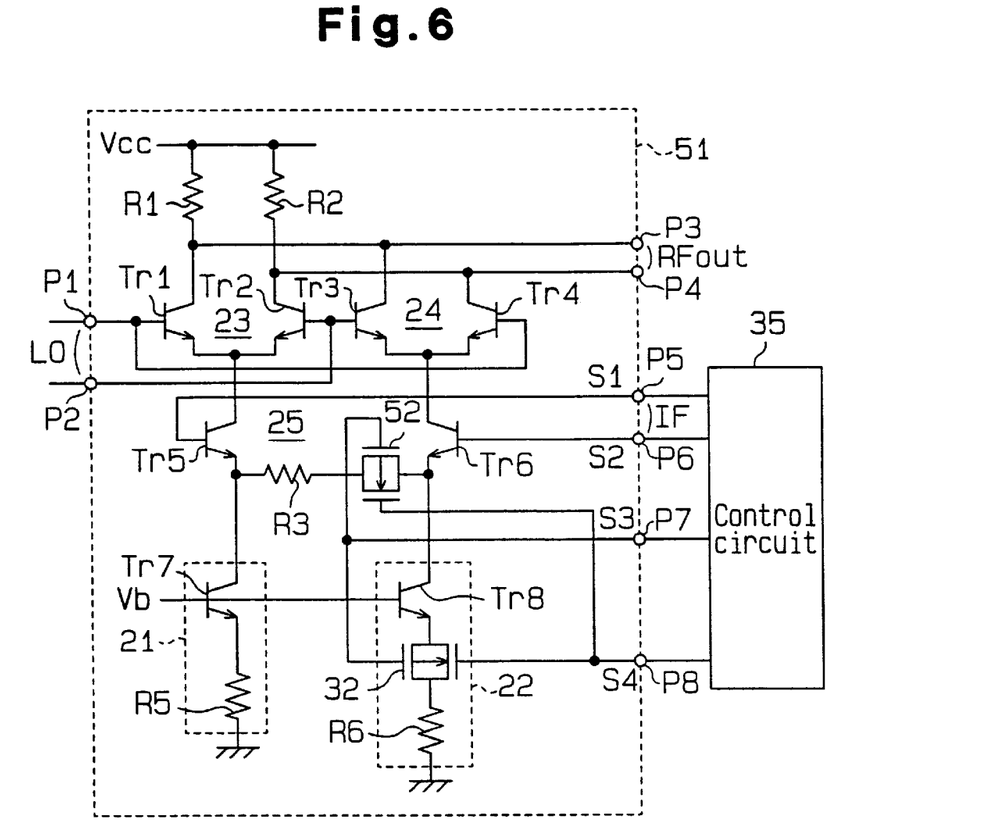
FIG. 6 is a circuit diagram of a double balanced mixer circuit according to a third embodiment of the present invention.

FIG. 6 is a circuit diagram of a mixer circuit 51 according to a third embodiment of the present invention. In the third embodiment, a second TR gate 52 connected between the emitter of the sixth transistor Tr6 and the resistor R3 is added to the mixer circuit 41 of FIG. 5. The second TR gate 52 may also be added to the mixer circuit 31 of FIG. 3. In this configuration, because the flow of current of the eighth transistor TrB is prevented via the resistor R3 during amp operation, the current consumption is reduced and the generation of spurious signals resulting from the flow of current through the resistor 3 is suppressed.

Figure 7:
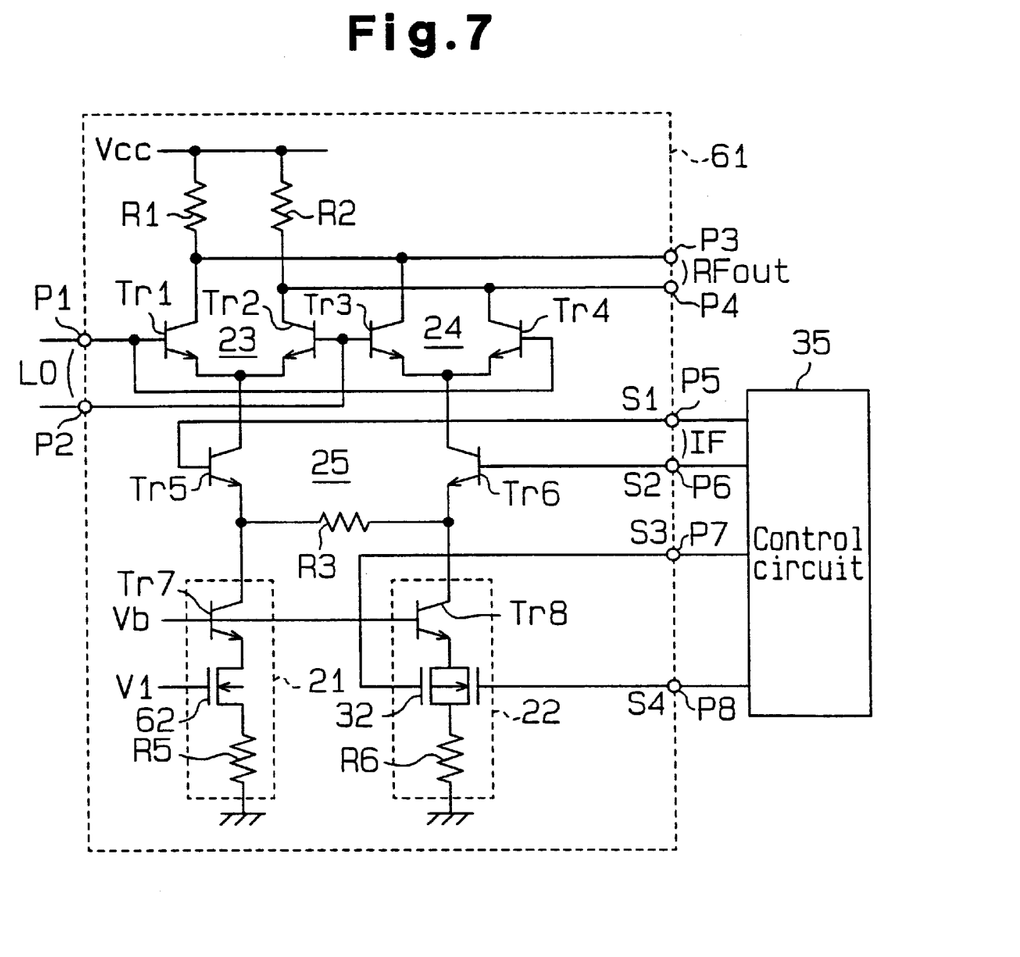
FIG. 7 is a circuit diagram of a double balanced mixer circuit according to a fourth embodiment of the present invention.
Figure 8:
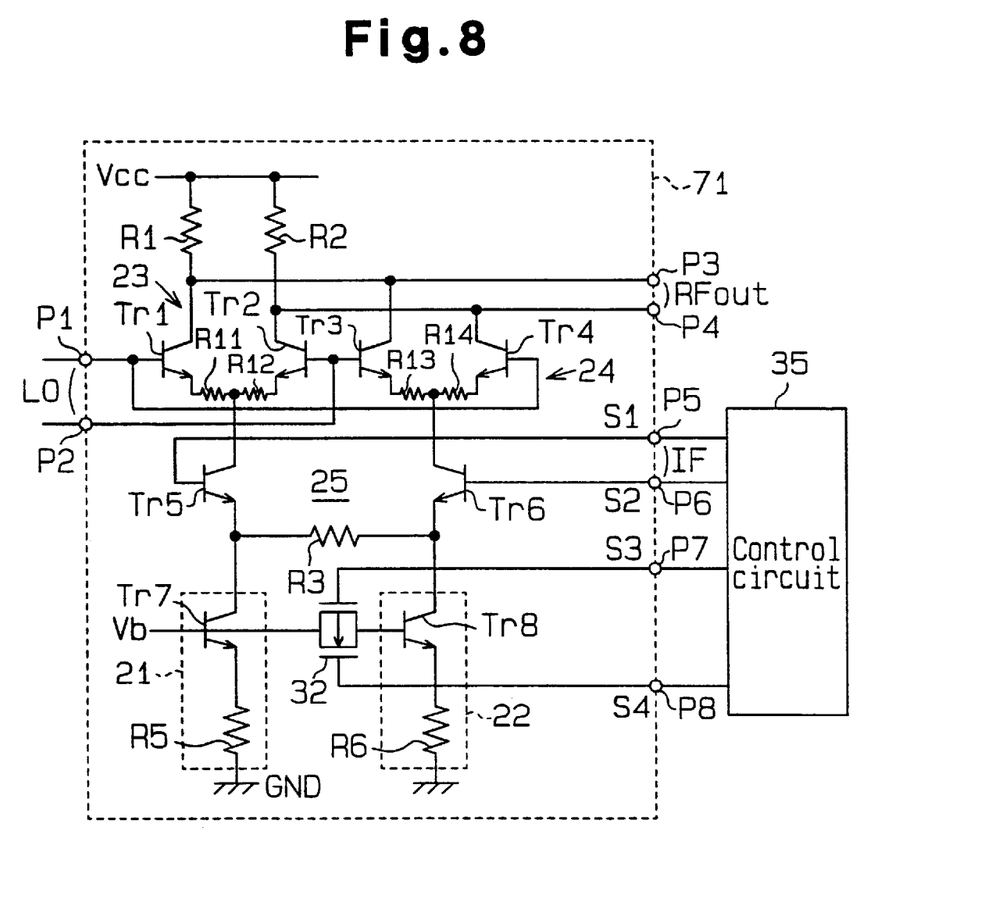
FIG. 8 is a circuit diagram of a double balanced mixer circuit according to a fifth embodiment of the present invention.

FIG. 7 is a circuit diagram of a mixer circuit 61 according to a fourth embodiment of the present invention. In the fourth embodiment, an NMOS transistor 62 connected between the seventh transistor Tr7 and the resistor R5 is added to the mixer circuit 41 of FIG. 5. A PMOS transistor may be used instead of an NMOS transistor. The NMOS transistor 62 (or PMOS transistor) may be added to the mixer circuit 31 of FIG. 3. In this configuration, by controlling a gate voltage V1 of the NMOS transistor 62 during amp operation, the amount of current flowing in the first constant-current source 21 is controlled and the gain of the amp circuit can be adjusted. FIG. 8 is a circuit diagram of a mixer circuit 71 according to a fifth embodiment of the present invention. In the fifth embodiment, resistors R11 to R14 are added to the mixer circuit 31 of FIG. 3. The resistors R11 and R12 are connected between the emitters of the first and second transistors Tr1 and Tr2. The resistors R13 and R14 are connected between the emitters of the third and fourth transistors Tr3 and Tr4. In this configuration, the gain during amp operation is suppressed.

The mixer circuits 31, 41, 51, 61, and 71 of FIG. 3 and FIGS. 5 to 8 may also be used as orthogonal modulators.

Figure 9:
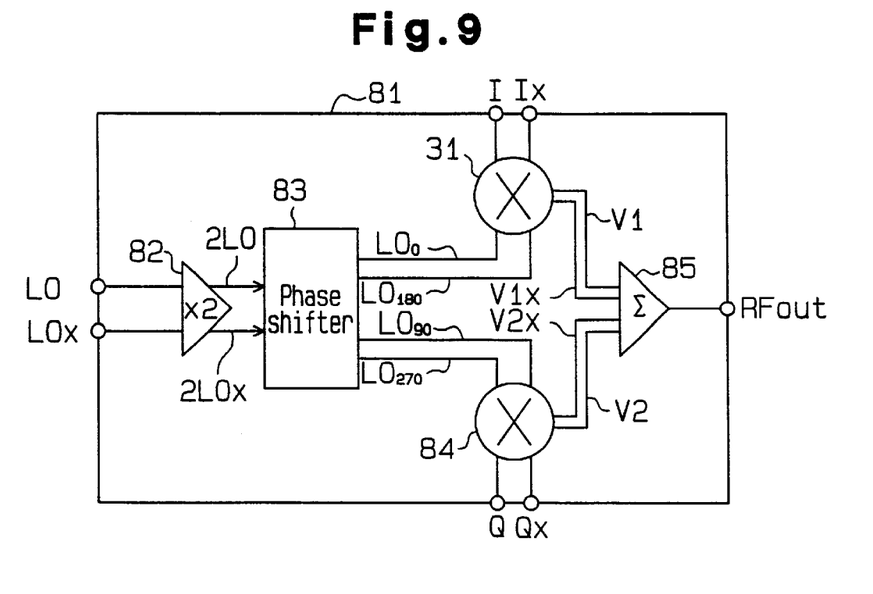
FIG. 9 is a circuit diagram of an orthogonal modulator including the double balanced mixer circuit of FIG. 3.

FIG. 9 is a schematic block diagram of an orthogonal modulator 81 which may be used in a digital mobile communication device. The orthogonal modulator 81 is equipped with a frequency multiplier 82, a phase shifter 83, the first modulation mixer 31 (mixer circuit of FIG. 3) as a modulation adder, a second modulation mixer 84, and an adder 85, all preferably formed on a single semiconductor substrate.

The frequency multiplier 82 receives complementary carrier signals LO and LOx and generates complementary signals 2LO and 2LOx in which the frequency of the carrier signal LO is multiplied by two.

The phase shifter 83 receives the complementary signals 2LO and 2LOx from the frequency multiplier 82 and generates carrier signals LO0, LO90, LO180, and LO270 whose phases are shifted by 90 degrees by frequency-dividing the frequencies of the complementary signals 2LO and 2LOx by two. Hence, the frequencies of the carrier signals LO0, LO90, LO180, and LO270 are the same as those of the carrier signals LO and LOx.

The carrier signals LO0 and L0180 are complementary to each other and are the in-phase components (hereinafter in-phase carrier signals) of the carrier signals LO90 and LO270. The carrier signals LO90 and LO270 are complementary to each other and are the orthogonal components (hereinafter orthogonal carrier signals) of the carrier signals LO and LOx.

The phase shifter 83 supplies the in-phase carrier signals LO0 and LO180 to the first modulation mixer 31 and supplies the orthogonal carrier signals LO90 and LO270 to the second modulation mixer 84.

The first modulation mixer 31 generates first modulation signals V1 and V1x (output signal RFout of FIG. 3) by mixing first base band signals I and Ix (base band signal IF of FIG. 3) and the in-phase carrier signals LO0 and LO180 (carrier signal LO of FIG. 3) from the phase shifter 83.

The second modulation mixer 84 generates second modulation signals V2 and V2x by mixing second base band signals Q and Qx and the orthogonal carrier signals LO90 and LO270 from the phase shifter 83. The adder 85 generates the output signal RFout by adding the first and second modulation signals V1, V1x, V2, and V2x.

Figure 10:
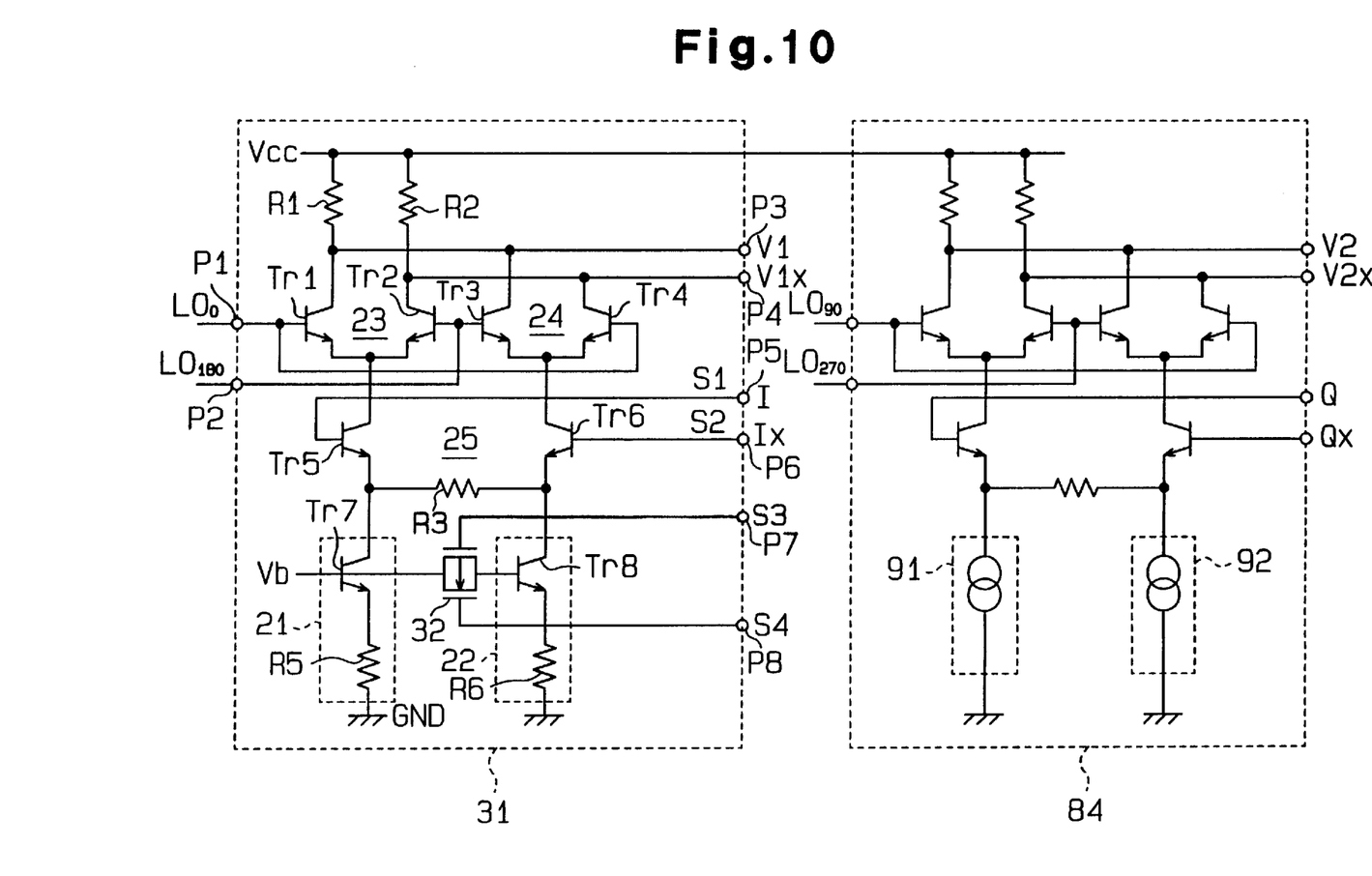
FIG. 10 is a circuit diagram of the double balanced mixer circuits of the orthogonal modulator of FIG. 9.

FIG. 10 is a schematic circuit diagram of the first and second modulation mixers 31 and 84. The second modulation mixer 84 is configured so that the operation of either the first constant-current source 91 or the second constant-current source 92 or both current sources 91, 92 stop in the manner described for the first to fifth embodiments.

For example, for analog communications, all of the operations of the circuit of the second modulation mixer 84 are stopped. The first modulation mixer 31 operates as the amp circuit 31a of FIG. 4 in response to the control signals S1 to S4. Hence, in a communication device having the orthogonal demodulator 81 for digital communications, analog communications are performed without separately providing any amp circuit.

Figure 11:
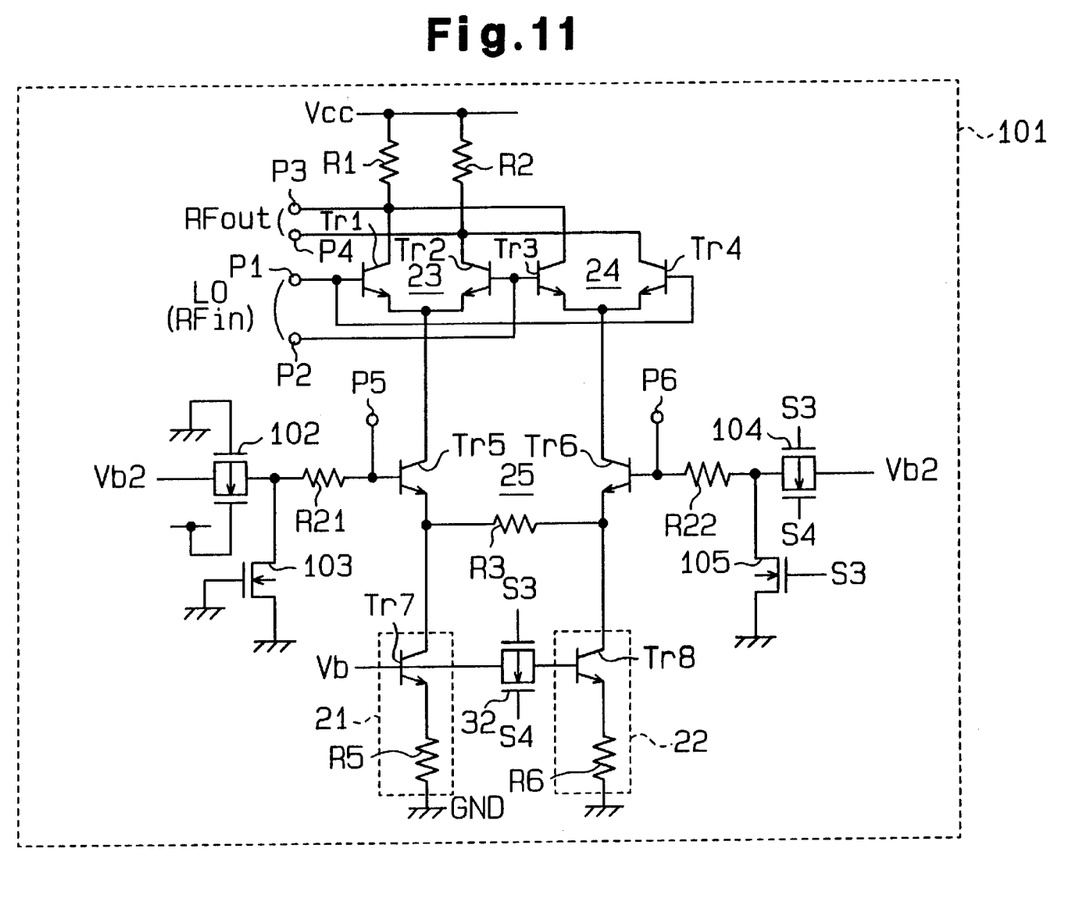
FIG. 11 is a circuit diagram of a double balanced mixer circuit according to a sixth embodiment of the present invention.

FIG. 11 is a circuit diagram of a mixer circuit 101 according to a sixth embodiment of the present invention. In the sixth embodiment, a bias voltage Vb2 is applied to the base of the fifth transistor Tr5 via a TR gate 102 and a resistor R21. The NMOS transistor gate of the TR gate 102 is connected to the high potential power supply Vcc, and the PMOS transistor gate is connected to a low potential power supply. Hence, the TR gate 102 is normally turned on. The node between the TR gate 102 and the resistor R21 is connected to the low potential power supply via an NMOS transistor 103. The gate of the NMOS transistor 103 is connected to the low potential power supply and accordingly, the NMOS transistor 103 is normally turned off.

The bias voltage vb2 is applied to the base of the sixth transistor Tr6 via a TR gate 104 and the resistor R21. The control signal S4 is applied to the NMOS transistor gate of the TR gate 104, and the control signal S3 is applied to the PMOS transistor gate. Hence, the TR gate 104 turns on or off simultaneously with the TR gate 32. The node between the TR gate 104 and the resistor R21 is connected to the low potential power supply via an NMOS transistor 105. The control signal S3 is applied to the gate of the NMOS transistor 105. Hence, the NMOS transistor 105 turns on (or off) when the TR gates 32 and 104 turn off (or on).

The mixer circuit 101 operates as a mixer circuit when a capacitance-coupled base band signal IF is supplied to the terminals P5 and P6. The mixer circuit 101 mixes the carrier signal LO supplied to the terminals P1 and P2 and the base band signal IF and outputs the output signal (modulation signal) RFout to the terminals P3 and P4.

When the mixer circuit 101 operates as an amp circuit, the TR gates 32 and 104 turn off and the NMOS transistor 105 turns on in response to the control signals S3 and S4. Hence, the supply of the bias voltage Vb to the second constant-current source 22 is stopped and the second constant-current source 22 stops operation. Further, the supply of the bias voltage Vb2 to the sixth transistor Tr6 is stopped, and the base of the sixth transistor Tr6 is grounded via the NMOS transistor 105. Thus, the third differential amplifier 25 is unbalanced and the second constant-current source 22 stops. Accordingly, the mixer circuit 101 operates as an amp circuit. As described above, in the sixth embodiment, the mixer circuit 101 operates as the mixer circuit or amp circuit using only the control signals S3 and S4.

It should be apparent to those skilled in the art that the present invention may be embodied in many other specific forms without departing from the spirit or scope of the invention. Particularly, it should be understood that the invention may be embodied in the following forms.

In the present invention, the operation of the first constant-current source 21 may be stopped instead of stopping the operation of the second constant-current source 22. Further, either the first constant-current source 21 or the second constant-current source 22 may be selectively stopped.

Therefore, the present examples and embodiments are to be considered as illustrative and not restrictive and the invention is not to be limited to the details given herein, but may be modified within the scope and equivalence of the appended claims.

What is claimed is:

1. A double balanced mixer comprising:
   a first differential amplifier including a first pair of transistors having their emitters connected to each other;
   a second differential amplifier including a second pair of transistors having their emitters connected to each other;
   a third differential amplifier, connected to the first and second differential amplifiers, including a third pair of transistors having their emitters connected to each other via a resistor;
   first and second constant-current sources connected to the emitters of the third pair of transistors, respectively; and
   a gate circuit, connected to one of the first and second constant-current sources, for selectively activating the connected one of first and second constant-current sources in response to a control signal;
   wherein each of the first and second constant-current sources includes:
      a constant-current transistor having a base that receives a bias voltage and a collector connected to the third differential amplifier; and
      a resistor connected between the emitter of the constant-current transistor and ground, and
      wherein the gate circuit is connected to the base of the constant-current transistor of one of the first and second constant-current sources.

2. The double balanced mixer of claim 1, wherein the gate circuit is a transmission gate.

3. The double balanced mixer of claim 1, further comprising a second gate circuit connected between the emitters of the third pair of transistors.

4. The double balanced mixer of claim 3, wherein the second gate circuit is a transmission gate.

5. The double balanced mixer of claim 1, further comprising a MOS transistor connected between the resistor and the constant-current transistor of the constant-current source not connected to the gate circuit.

6. The double balanced mixer of claim 1, further comprising resistors connected between the emitters of the transistors of the first and second differential amplifiers.

7. A double balanced mixer comprising:
  a first differential amplifier including a first pair of transistors having their emitters connected to each other;
  a second differential amplifier including a second pair of transistors having their emitters connected to each other;
  a third differential amplifier, connected to the first and second differential amplifiers, including a third pair of transistors having their emitters connected to each other via a resistor;
  first and second constant-current sources connected to the emitters of the third pair of transistors, respectively; and
  a gate circuit, connected to one of the first and second constant-current sources, for selectively activating the connected one of first and second constant-current sources in response to a control signal;
  wherein each of the first and second constant-current sources includes:
    a constant-current transistor having a base that receives a bias current and a collector connected to the third differential amplifier; and
    a resistor connected between the emitter of the constant-current transistor and a ground; and
    wherein the gate circuit is connected between the resistor and the constant-current transistor of the connected one of the first and second constant-current sources.

8. The double balanced mixer of claim 7, wherein the gate circuit is a transmission gate.

9. The double balanced mixer of claim 7, further comprising a second gate circuit connected between the emitters of the third pair of transistors.

10. The double balanced mixer of claim 9, wherein the second gate circuit is a transmission gate.

11. The double balanced mixer of claim 7, further comprising a MOS transistor connected between the resistor and the constant-current transistor of the constant-current source whose base is not connected to the gate circuit.

12. The double balanced mixer of claim 8, further comprising resistors connected between the emitters of the transistors of the first and second differential amplifiers.

13. An orthogonal modulator comprising:
  a frequency multiplier for receiving a carrier signal and generating a multiplied signal in which the frequency of the carrier signal is multiplied by a predetermined factor;
  a phase shifter, connected to the frequency multiplier, for receiving the multiplied signal and generating a first carrier signal which is an in-phase component of the carrier signal, and a second carrier signal which is an orthogonal component of the carrier signal, by dividing the multiplied signal;
  a first mixer, connected to the phase shifter, for receiving the first carrier signal and a first base band signal and generating a first modulation signal by mixing the first carrier signal and the first base band signal;
  a second mixer, connected to the phase shifter, for receiving the second carrier signal and a second base band signal and generating a second modulation signal by mixing the second carrier signal and the second base band signal; and
  an adder, connected to the first and second mixers, for receiving the first and second modulation signals and generating an output signal by adding the first and second modulation signals;
  wherein the first mixer includes,
    a first differential amplifier including a first pair of transistors having their emitters connected to each other and their bases receiving the first carrier signal,
    a second differential amplifier including a second pair of transistors having their emitters connected to each other and their bases receiving the first carrier signal,
    a third differential amplifier, connected to the first and second differential amplifiers, including a third pair of transistors having their emitters connected to each other via a resistor and their bases receiving the first base band signal,
    first and second constant-current sources connected to the emitters of the third pair of transistors, respectively, and
    a first gate circuit, connected to one of the first and second constant-current sources, for selectively activating the connected one of the first and second constant-current sources in response to a control signal, and
  the second mixer includes,
    a fourth differential amplifier including a fourth pair of transistors having their emitters connected to each other and their bases receiving the second carrier signal,
    a fifth differential amplifier including a fifth pair of transistors having their emitters connected to each other and their bases receiving the second carrier signal,
    a sixth differential amplifier, connected to fourth and fifth differential amplifiers, including a six pair of transistors having their emitters connected to each other via a resistor and their bases receiving the second base band signal,
    third and fourth constant-current sources connected to the emitters of the sixth pair of transistors, respectively, and
    a second gate circuit, connected to one of the third and fourth constant-current sources, for selectively activating the connected one of the third and fourth constant-current sources in response to the control signal.

* * * * *